(12) United States Patent
Johnson

(10) Patent No.: US 8,270,630 B2
(45) Date of Patent: Sep. 18, 2012

(54) AUTOMATIC AND DYNAMIC NOISE CANCELLATION FOR MICROPHONE-SPEAKER COMBINATIONS

(75) Inventor: Timothy M. Johnson, San Jose, CA (US)

(73) Assignee: Apple Inc., Cupertino, CA (US)

( * ) Notice: Subject to any disclaimer, the term of this patent is extended or adjusted under 35 U.S.C. 154(b) by 638 days.

(21) Appl. No.: 12/535,505

(22) Filed: Aug. 4, 2009

(65) Prior Publication Data
US 2011/0033065 A1 Feb. 10, 2011

(51) Int. Cl.
*H04B 3/00* (2006.01)
(52) U.S. Cl. ..... 381/77; 381/123; 381/111; 379/387.01; 379/388.05; 330/69
(58) Field of Classification Search ...... 381/71.1–71.14, 381/56, 57, 61, 74, 77, 94.1, 107, 111, 123, 381/370, 375, 376; 379/387.01, 388.05; 330/67, 69
See application file for complete search history.

(56) References Cited

U.S. PATENT DOCUMENTS

| | | | | |
|---|---|---|---|---|
| 5,033,090 | A | * | 7/1991 | Weinrich ........................ 381/318 |
| 5,208,865 | A | * | 5/1993 | Friske et al. .................. 381/94.5 |
| 5,408,533 | A | * | 4/1995 | Reiffin ............................ 381/96 |
| 6,016,136 | A | * | 1/2000 | Fado et al. ..................... 715/721 |
| 6,060,933 | A | | 5/2000 | Jordan et al. |
| 2007/0049103 | A1 | * | 3/2007 | Kashi et al. .................... 439/396 |
| 2007/0273438 | A1 | * | 11/2007 | Hickman et al. ................ 330/69 |

OTHER PUBLICATIONS

"Feature-Rich, Complete Audio Record/Playback for GSM/GPRS Cell Phones", MAXIM Integrated Products, Sunnyvale, CA, USA, Sep. 12, 2005, (8 pages).
"Op Amp Circuit Collection", AN-31, National Semiconductor, Application Note 31, Sep. 2002, (33 pages).
"Stereo Audio CODECs with Microphone, DirectDrive Headphones, Speaker Amplifiers, or Line Outputs", MAX9851/MAX9853, MAXIM Integrated Products, Sunnyvale, CA, USA, 19-3732; Rev. 2; Jul. 2007, (71 pages).

* cited by examiner

*Primary Examiner* — Vivian Chin
*Assistant Examiner* — Paul Kim
(74) *Attorney, Agent, or Firm* — Blakely, Sokoloff, Taylor & Zafman LLP

(57) ABSTRACT

An audio host device has a headset electrical interface in which a reference contact is shared by a microphone and a speaker. A variable or programmable gain amplifier, PGA, has a signal input coupled to a sense point for the reference contact. A first difference amplifier has its inputs coupled to a microphone contact and the PGA through a first gain stage; a second difference amplifier has its inputs coupled to the microphone contact and to the output of the PGA, through a second gain stage having a different gain than the first gain stage; a third difference amplifier has its inputs coupled to the microphone contact and the output of the PGA through a third gain stage having a gain in between that of the first and second gain stages. A controller monitors outputs of the first and second difference amplifiers and changes a gain setting of the PGA. Other embodiments are also described and claimed.

19 Claims, 6 Drawing Sheets

AUTOMATIC AND DYNAMIC NOISE CANCELLATION FOR MICROPHONE-SPEAKER COMBINATIONS

An embodiment of the invention relates to noise cancellation techniques that improve headset-based audio communications using a portable host device. Other embodiments are also described.

BACKGROUND

For two-way, real-time audio communications, referred to here generically as voice or video telephony, a user can wear a headset that includes a single earphone (also referred to as a headphone or a speaker) and a microphone, or a pair of stereo earphones and a microphone, that are connected to a host communications device such as a smart phone. The headset, which integrates the earphones with a microphone, may be connected to the host device through a 4-conductor electrical interface typically referred to as a headset plug and jack matching pair. The four conductors are used as follows: two of them are used for the left and right earphone signals, respectively; one of them connects a microphone signal; and the last one is a reference or power return, conventionally taken as the audio circuit reference potential. The plug that is at the end of the headset cable fits into a mating 4-conductor jack that is integrated in the housing of the host device. Connections are made within the host device from the contacts of the headset jack to various audio processing electronic components of the host device.

Packaging restrictions in host devices such as a smart phone or a cellular phone create difficult challenges for routing the signal and power lines. For example, the headset jack is often located distant from the main logic board on which the audio processing components are situated, so that the headset signal needs to be routed through a flexible circuit and one or more board-to-board connectors. The multiple connections increase the impedance of the connection, as well as the manner in which the connections are made namely through narrow or thin metal circuit board traces, can lead to the coupling of audio band noise during operation of the host device. In addition, with the shared nature of the headset's reference or ground contact (shared by the microphone and the earphones of the headset), further noise is produced at the output of the microphone preamplifier. The preamplifier provides an initial boost to the relatively small microphone signal that is received from the headset. The practical effect of such audio noise at the output of the microphone preamplifier is often that the listener at the far end of a telephone conversation hears an echo of her own voice, with a concomitant reduction in the quality of the sound.

Attempts to reduce (or, as generically referred to here, "cancel") the noise at the output of the microphone preamplifier have been made. In one case, the concept of differentially sensing the microphone signal is used. For this purpose, a differential amplifier (in contrast with a single-ended amplifier) is used to only amplify the difference between the voltage at a sense point for the headset ground contact and the voltage at a sense point for the microphone signal contact. Using such a configuration, any audio voltage that may appear as noise between a local ground (local to the microphone preamplifier) and the ground that is near the headset jack or socket are largely rejected (that is, not significantly amplified), while the audio signal on the microphone signal contact is amplified.

SUMMARY

Packaging constraints and compromises of the microphone and earphone signals and their common return in the host device leads to a common mode imbalance that can cause undesired common mode noise to be coupled into either a microphone signal loop or a speaker signal loop. In practice the microphone signal loop is more prone to contamination by offensive audio band noise. In addition, compromised routing of the audio signals represents a finite impedance that can act as a victim impedance for near-by sources of noise within the host device, whether of low frequency similar to the audio base bandwidth, frequencies subject to heterodyning or fold over by sampled data converters, or non-linear impedances capable of demodulating local radio frequency energy.

The differential sensing approach described above in the Background section for ameliorating microphone preamp noise falls short, when the following practical considerations are taken into account. First, there are several different types of headsets in the marketplace, each of which may have a different type of microphone circuit. Moreover, there are manufacturing variations in the microphone circuit, even for the same make and model of headset. Finally, manufacturing as well as temperature variations could also affect the electrical characteristics of a flexible circuit or board-to-board connector that is used to connect with the headset interface within the host device. Any successful attempt to cancel the microphone noise, by differentially sensing the microphone signal, will require knowledge of the precise electrical characteristics of the relevant circuitry, in each instance of the manufactured host device and headset combination. This however is not a practical solution.

An embodiment of the invention is an improved circuit for reducing microphone amplifier noise in a two-way audio communications host device. The circuit provides a more robust solution in that it is able to perform good noise reduction for different types or brands of headsets whose microphone circuits have different impedances. It can also compensate for parasitic effects in the host device that may have been caused by compromised signal or ground routing between the host headset connector and the microphone amplifier. The circuit can operate automatically and dynamically, i.e., without requiring specific input from, and being generally inconspicuous to, the end user of the host device.

An audio host device in accordance with an embodiment of the invention has the following elements. An electrical interface has a speaker contact, a microphone contact, and a reference contact. The reference contact is to be shared by a connected microphone and speaker. The reference contact is also directly coupled to a power return plane of the audio host device.

A microphone preamplifier (or, simply, amplifier) is implemented using the following combination of elements. A programmable gain amplifier, PGA, also referred to as a reference sense amplifier, has a signal input coupled to a sense point for the reference contact. A signal output of the PGA is coupled to an input of each of three difference amplifiers. The other input (complimentary) of each difference amplifier is coupled to the microphone contact.

With a first difference amplifier, one of its inputs is coupled to the PGA signal output through a first gain stage. These are referred to as the alpha gain stage and the alpha difference amplifier.

With a second difference amplifier, one of its inputs is coupled to the PGA signal output through a second gain stage. These are referred to as the beta gain stage and the beta difference amplifier.

In a third difference amplifier, one of its inputs is coupled to the PGA signal output through a third gain stage, referred to as the gamma gain stage and the gamma difference amplifier. The gain of the gamma stage lies in between that of the alpha and beta stages (e.g., the average of the two). The gains of the three difference amplifiers may be equal.

A controller is provided that has an output coupled to a control input of the PGA. The controller monitors outputs of the first and second difference amplifiers, and in response changes a gain setting of the PGA until the output of the third difference amplifier yields reduced noise. The output of the third difference amplifier may be considered to be the output of the microphone preamplifier, which produces the uplink audio signal of a real-time, two-way communications channel for the end user of the host device.

To find out which gain setting for the PGA yields the lowest noise at the preamplifier output, the following closed loop, configuration or calibration process may be conducted. The controller sweeps the gain of the PGA while monitoring the sizes of the signals at the outputs of the first and second difference amplifiers, until the sizes at the two outputs are about equalized. At that point, the signal size at the output of the third difference amplifier may be presumed to be less than at the output of either the first or second difference amplifier. The gain setting that yielded this condition may then be accepted as the final gain setting for the PGA. Configured in this manner, the third difference amplifier will produce the boosted microphone signal with improved signal to noise ratio. This configuration process may be performed "in the field", i.e. while the host device is used in its normal course by the end user, in a manner that is generally inconspicuous to the end user.

In one embodiment, the controller may request that a test signal be generated and played through the speaker contact of the electrical interface, during the configuration process and while the microphone-speaker combination is connected. The test signal may include a super-audible tone that cannot be heard by the user. The final gain setting of the PGA may then be the one that yields an equal amount of the super-audible tone at the outputs of the first and second difference amplifiers. With PGA configured according to the final gain setting, the microphone preamplifier is deemed calibrated, so that the signal from the output of the third difference amplifier can be used as the uplink audio signal that is transmitted, e.g. during a telephone call, with improved signal to noise ratio and reduced far end echo.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. While numerous details are set forth, it is understood that some embodiments of the invention may be practiced without these details. In other instances, well-known circuits, structures, and techniques have not been shown in detail so as not to obscure the understanding of this description.

Figure 1:
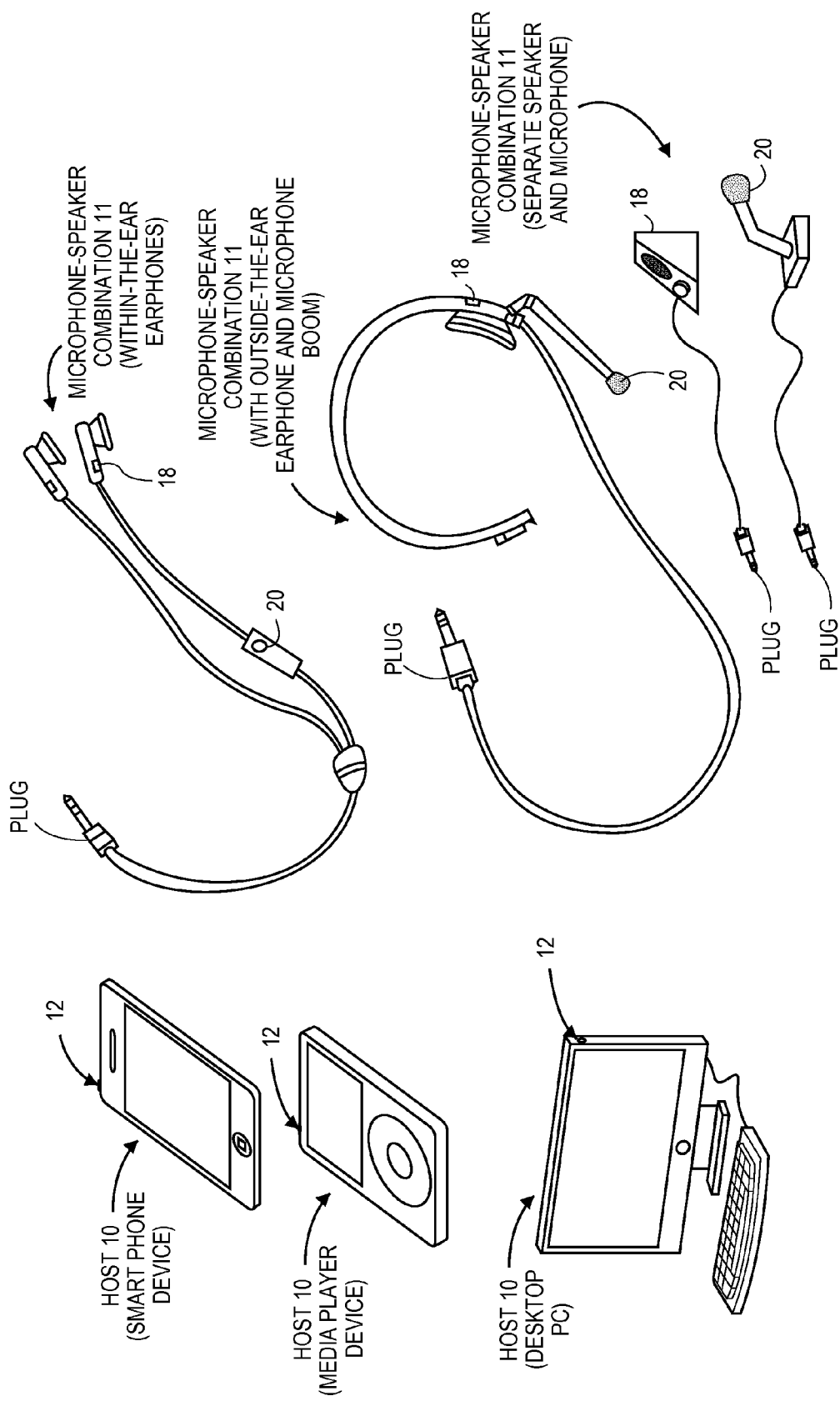
FIG. 1 shows several different combinations of host devices and microphone-speaker combinations in which one or more embodiments of the invention can appear.

FIG. 1 shows several types of host devices 10 and microphone-speaker combinations 11 in which various embodiments of the invention can be implemented. In particular, a noise reduction (here generally referred to as noise cancellation) mechanism may be integrated entirely within a device housing of the host 10. The host 10 may be a smart phone device, a media player device, or a desktop or portable personal computer. The host 10 has a microphone-speaker combination electrical interface 12, which is generically referred to here as a "headset" electrical interface 12, only for convenience. The headset electrical interface 12 may include what is typically referred to as a jack or connector that is integrated into the host housing. Although not shown, the host 10 also includes conventional audio processing components that enable a two-way real time audio communications session or conversation (voice or video telephony) between a near end user of the host 10 and far end user. These may include a communications signal processor that produces or transmits an uplink communications signal from the output of a microphone preamplifier (uplink audio signal), and receives a downlink communications signal from which a downlink audio signal is generated. The conversation may be conducted in a cellular network telephone call, a plain old telephone system or analog call, or an Internet telephony call, or other duplex voice channel, e.g. a conference call convened by any of the above media or a multimedia application requiring simultaneous voice input and output from two or more users.

The host 10 may be coupled to one or more microphone-speaker combinations 11, through its headset electrical interface 12. Several different types of microphone-speaker combinations 11 that can be used are shown, including two different types of headsets (one in which a pair of earphones or headphones are in loose form, and another where a single earphone is attached to a microphone boom) and a combination microphone stand and desktop loudspeaker. Each of these microphone-speaker combinations 11 can be a separate item than the host device 10, and can be coupled to the host device 10 through a cable connector that mates with the headset electrical interface 12 in the housing of the host device 10.

Figure 2A:
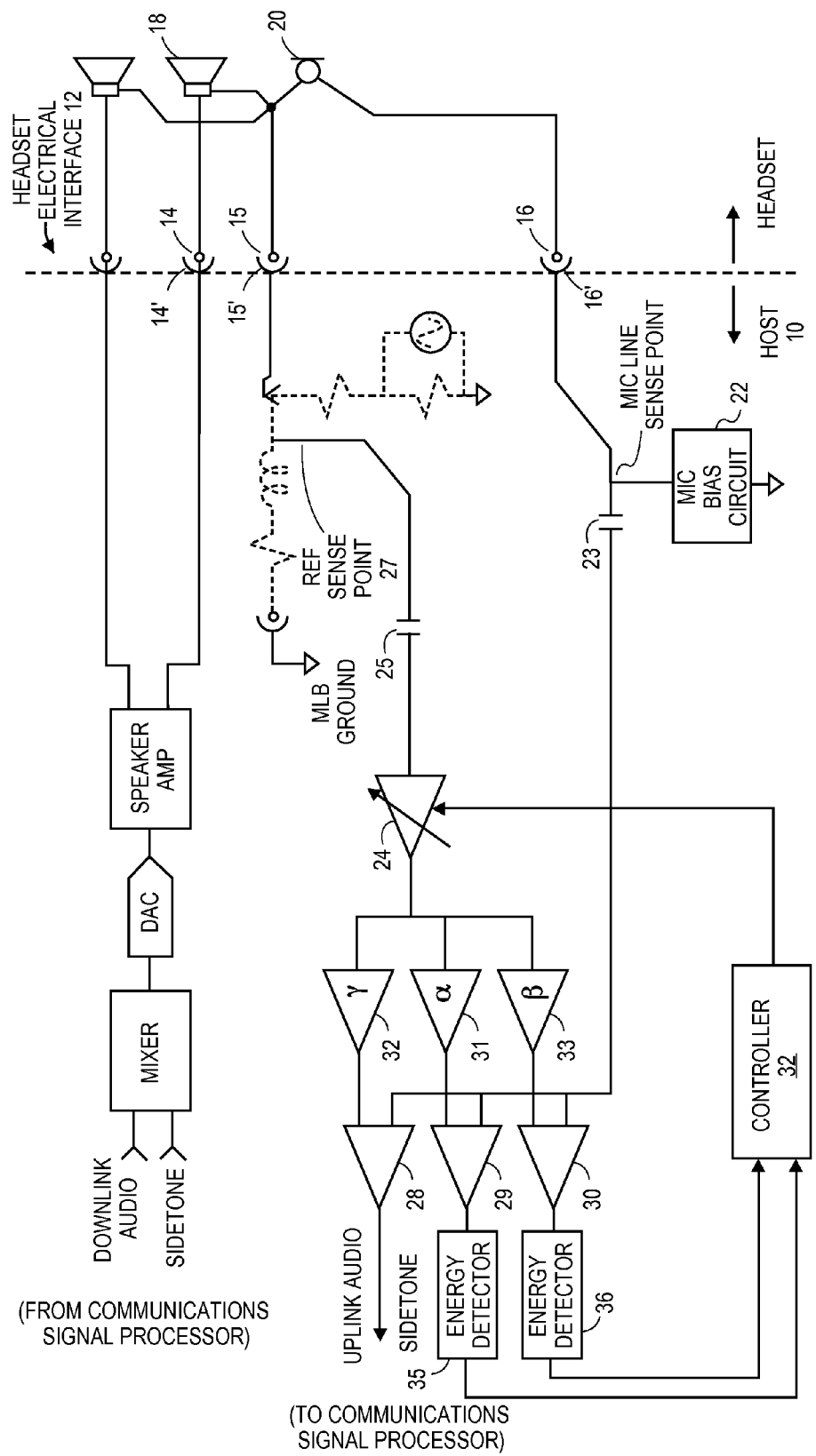
FIG. 2A is a circuit diagram of an embodiment of the invention.

Referring now to FIG. 2A, a circuit schematic of an embodiment of the invention is shown. In this embodiment, each speaker 18 has a power return terminal that is connected to a shared reference or ground contact 15, the latter being located in a cable connector (e.g., a plug). The reference contact 15 in the plug mates with a corresponding reference contact 15' of a host-side connector (e.g., a jack) integrated in the host 10. A pair of speaker contacts 14 that make a direct connection with their respective contacts 14' of the host connector. Finally, the microphone-speaker combination 11 also includes a microphone circuit 20 that shares the reference contact 15 with the speakers 18. The microphone circuit 20 also has a signal output terminal that is connected to its separate microphone contact 16 (which mates with a corresponding microphone contact 16' of the host-side connector in the host 10). This microphone-speaker combination 11 may be a conventional headset in which the microphone circuit 20 and the speaker 18 are integrated.

In a typical case, all four of the contacts shown in FIG. 2A for the headset electrical interface 12 are integrated in the same connector (e.g., a 4-conductor headset jack in the host 10, and a mating headset plug). Note that although the example here is a headset electrical interface 12 that has four contacts, the concepts of the invention are also applicable to a mono system that requires only three contacts, that is a single speaker contact 18, a shared reference contact 15, and a single microphone contact 16. There may be additional contacts integrated in the headset electrical interface 12 that are not relevant here.

In some cases, there may be multiple microphones in the microphone-speaker combination 11 that share the same reference contact 15', e.g. a headset with an integrated microphone array that can be used to implement an audio beamforming function by the host device 10. For that scenario, the headset electrical interface 12 could have more than one microphone contact 16', one for each of the microphones of the array.

Figure 2B:
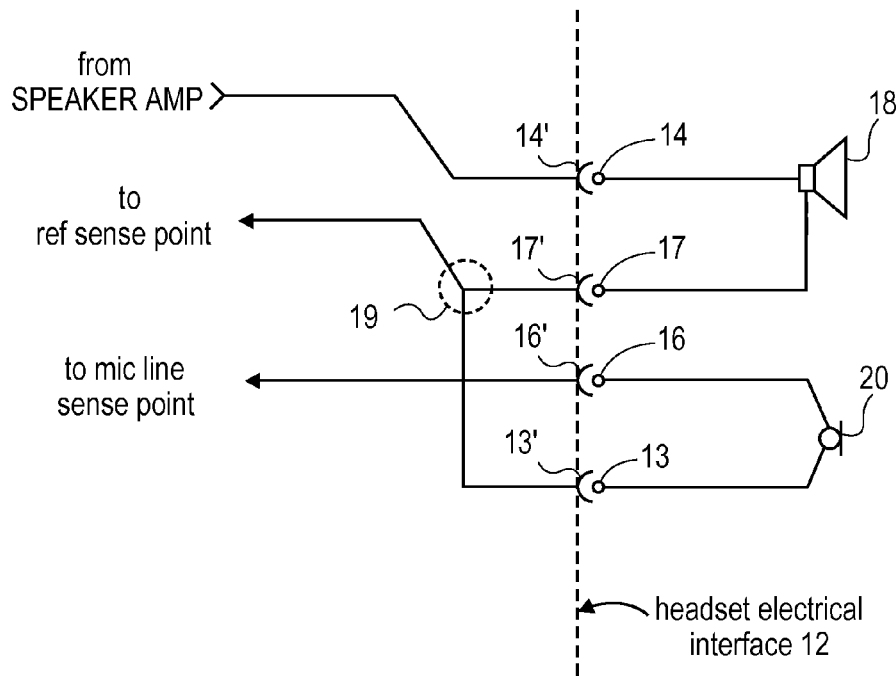
FIG. 2B is a circuit diagram of another possible arrangement for the shared reference contact in the host device.

Note that in FIG. 2A, the reference contact 15' in the host device 10 is a node that is shared, by the return terminals of the speaker 18 and microphone circuit 20. In this case, the return terminals are electrically joined or directly connected to each other outside the host device 10. An alternative to this scheme is where separate connectors are used for the speaker 18 and the microphone circuit 20, e.g. a microphone stand and a separate desktop speaker as shown in FIG. 1. The circuit schematic of this embodiment is shown in FIG. 2B. Here, the return terminals of the speaker and microphone are electrically joined inside the host device 10. The speaker and microphone connectors have separate ground contacts 17, 13, and inside the host device 10 the node 19 is joined to the host side contacts 17', 13' as shown.

With the microphone-speaker combination 11 connected to the host device 10, a user of the host device can hear the far end user talking during a telephone call and can speak to the far end user at the same time, via the speakers 18 and microphone circuit 20, respectively. The voice of the far end user originates in a downlink communications signal that arrives into the host 10 over a communications network. A downlink audio signal may be in digital form when it is processed by a communications signal processor (not shown) with several stages that may include various digital signal processing operations, including a mixer that allows the addition of sidetone. The downlink audio signal with the sidetone is then converted into analog form using a digital to analog converter (DAC), before being applied to the headset electrical interface 12 by a speaker amplifier. At the same time, the near end user may speak into the microphone circuit 20, which picks up the voice as an uplink audio signal that passes through the headset interface 12 (in particular the microphone contacts 16, 16'). The uplink audio signal is then boosted by the microphone preamplifier and may then be converted into digital form by an analog to digital converter (ADC). This allows the generation of a digital sidetone signal (which is fed back to the speaker 18 as explained above). In addition, the uplink audio signal may be subjected to further digital signal processing before being transmitted to a remote device (e.g., the far end user's host device) over the communications network as an uplink communications signal.

Specifics of the noise cancellation circuitry in the host 10 are now described. Still referring to FIG. 2A, the reference contact 15' is routed and directly connected to a circuit board layer that is at the ground or reference voltage. This may be the reference relative to which a power supply voltage Vcc is measured, which powers the various electrical circuit components of the host 10, including audio processing components such as the microphone amplifier. The power return plane is also referred to here as the main logic board (MLB) ground.

Due to practical limitations, the electrical connection or direct coupling between the reference contact 15' and the MLB ground that is at the microphone amplifier is not identically zero ohms, particularly in the audio frequency range. This may be due to various physical structures that create parasitic or stray effects, represented in FIG. 2A by virtual resistors, capacitors and inductors (shown in dotted lines). For the audio frequency range, the primary parasitic or stray components of concern may be series resistors, inductors, and an equivalent noise voltage source, all of which are depicted by dotted lines. The practical limitations that cause the parasitic effects may include spring contacts and board-to-board connectors, including those that are part of a flexible wire circuit that may be needed due to packaging constraints within the housing of the host device 10. As to the audio noise source shown, this may be primarily due to the reference contact 15 being shared by both the microphone circuit 20 and one or more speakers 18.

There are different types of microphone-speaker combinations 11 that can be used with the same host connector, each of which may have a different type of microphone circuit 20. For example, there are passive microphone circuits that are essentially passive acoustic transducers that produce an analog transducer signal on the microphone contact 16. There are also non-passive or active microphone circuits 20 that drive a modulated signal on the microphone contact 16. In both cases, a dc microphone bias circuit 22 may be needed in the host device 10, coupled to the microphone contact 16' as shown, to provide a dc bias voltage for operation of the microphone circuit 20.

An attempt to cancel or reduce microphone-speaker combination noise, which appears in the uplink communications signal and may manifest itself when the far end user hears an echo of his own voice during a telephone call, calls for differentially sensing the microphone signal. As explained above in the Summary section, however, such a technique should be performed carefully else the noise reduction attempt will be ineffective. The different types of microphone circuits 20 present different impedances (both at dc and in the audio range) on the microphone contact 16'. Moreover, there are manufacturing variations in the microphone circuits 20, even for the same make and model of microphone-speaker combination. Thus, knowledge of the precise impedance characteristics of the microphone circuit 20, in addition to a good estimate of the parasitic components that cause a substantial difference between a signal at the output terminal of the microphone circuit 20 and what should be the same signal at the input terminal of the microphone amplifier in the host device 10, are needed. Such detailed knowledge however is not available to a single entity at the time of manufacture of the host 10 and the microphone-speaker combination 11, because a purchaser of the host device 10 may elect to use any one of a large variety of different types or brands of microphone-speaker combinations including some that may not be available during the time the audio processing functions of the host device 10 are being designed.

Still referring to FIG. 2A, a noise reduction scheme that is more robust, i.e. it will work to provide improved signal to noise ratio and/or reduced far end user echo with several different types of microphone-speaker combinations 11, is now described. In one embodiment, the microphone preamplifier has a programmable gain amplifier (PGA) 24 that is used to sense the reference contact 15' through a sense point 27 as shown. This may be a single-ended (as opposed to differential) analog amplifier whose principal gain is digitally controllable via its control input. The amplified voltage that appears at the output of the PGA 24 is then subtracted from a signal that represents the voltage at the microphone contact 16' (obtained through a microphone sense point as shown). The subtraction may be performed by a difference amplifier 28. The latter is also referred to here as the gamma difference amplifier 28 because the sensed reference signal from the PGA 24 that is input to the difference amplifier 28 has been amplified in accordance with a further gain stage 32, having a gain $\gamma$.

The PGA 24 can be configured into any one of several gain states. As a whole, these are designed to provide enough granularity and range for reducing noise at the output of the difference amplifier 28, for as many different types of microphone-speaker combinations 11 as expected to be practical. The range and granularity of the gain states may be determined empirically, during testing or development of the host device 10, to be that which will provide best noise reduction for all of the different, expected microphone-speaker combinations, as explained below.

The input of the difference amplifier 28 that receives the microphone signal may be referred to as the hot input, while its complimentary cold input receives the sensed reference signal. The hot input may be AC coupled to the sense point for the microphone contact 16', i.e. through a DC blocking capacitor 23 as shown. The capacitor 23 may be coupled as shown, where one side is at the microphone sense point, which is connected to the microphone bias circuit 22, and the other is at the hot input. The cold input of the difference amplifier 28 is also AC coupled, to the sense point for the reference contact 15', through, i.e. through a DC blocking capacitor 25 as shown. Note that in other embodiments, the coupling between the inputs of the difference amplifier 28 and the microphone and reference sense points may be different, while still having constant gain through the normal and common mode bands of interest.

The exact electrical characteristics of the microphone loop (in particular the portion starting at the mic sense point, moving through the mic contacts 16', 16, the microphone circuit 20, to the reference sense point 27) are unknown for any given host device 10 and its connected speaker-microphone combination 11 (see FIG. 1). This means that the desired gain setting for the PGA 24 that will yield an acceptably high signal to noise ratio (SNR) at the output of the difference amplifier 28 is also unknown. The following presumptions may be made in this case: if the set PGA gain is too large, then the difference amplifier will subtract too much noise; if the set gain is too small, then too little noise is subtracted. In both cases, the resulting SNR may not be sufficiently high or optimal.

The following technique may be used to find the PGA gain setting that results in the lowest resultant noise at the output of the gamma difference amplifier 28. Still referring to FIG. 2A, an additional pair of difference amplifiers 29, 30 are added that may be essentially replicates of the difference amplifier 28, including having the same gain. A pair of gain stages 31, 33 are coupled between the inputs of their respective difference amplifiers 29, 30 and the output of the PGA, in a manner similar to the gain stage 32, except that their gains $\alpha$ and $\beta$ are different. More specifically, $$\alpha > \gamma > \beta$$

Figure 2C:
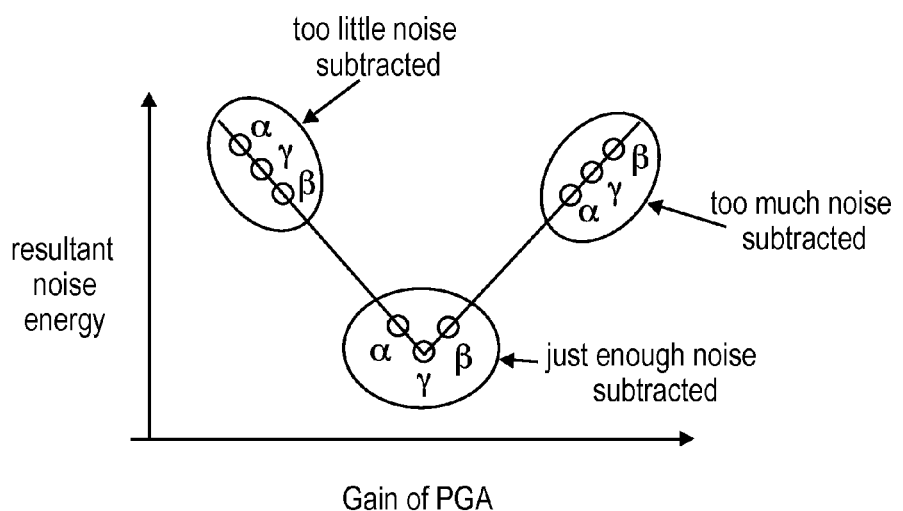
FIG. 2C shows resultant noise behavior vs. gain.

With such an arrangement, it is possible to sweep the gain setting of the PGA 24 while monitoring the resultant noise at the outputs of the difference amplifiers 28, 29, 30. This may yield the resultant noise behavior shown in FIG. 2C, where the data points represent a measure of the noise (e.g., signal processing energy, signal processing power, or a root mean square, RMS, value) at the outputs of the three difference amplifiers (or the three channels corresponding to the gain stages gamma, alpha and beta). In this example, the noise of the alpha channel is initially greater than both the beta and the gamma channels, but as the PGA gain rises above a given threshold, the roles are reversed and the beta channel becomes greater than the other two. In view of this behavior, the following technique may be used for determining the desired or optimal PGA gain setting (that may minimize the noise): if $\gamma=(\alpha+\beta)/2$, i.e. gamma is set to be about the average of alpha and beta, then when the resultant noise of the alpha and beta channels are about equal, the final PGA setting has been found because the resultant microphone-speaker noise in the gamma channel at that point should be at or close to its minimum.

In practice, the following functional components that have been described above may be implemented in either analog or digital form: difference amplifiers 28, 29, 30; gain stages 32, 31, 33; energy detectors 35, 36; mixer; super-audible tone generator 40.

To manage the above-described microphone preamplifier configuration or calibration process, for finding the final gain setting of the PGA 24, an embodiment of the invention has a controller 42 that can automatically and dynamically perform such a process, i.e. without requiring user intervention and at essentially any time the audio processing capabilities of the device are active during field use of the host device 10 by its user. The controller 42 may be implemented as a programmed processor (e.g., an applications processor in a smart phone that is executing software or firmware) designed to manage the overall process. The controller has an output coupled to a control input of the PGA 24 to set the gain of the PGA. The controller 42 monitors outputs of the difference amplifiers 29, 30 and in response changes the gain setting of the PGA 24. This adjustment process is designed to reduce and minimize the microphone-speaker combination noise at the output of the difference amplifier 28.

The controller 42 may be designed to adjust (e.g., sweep) the gain of the PGA 24 (e.g., as in FIG. 2C), from lowest to highest or vice versa, until a minimum occurs in the gamma channel. This may be detected by monitoring the signal energy of the alpha and beta channels. For that purpose, a pair of conventional, signal energy detectors 35, 36 may be added, coupled to the outputs of the alpha and beta channels as shown in FIG. 2A. As an alternative to the energy detector 35, 36, some form of RMS value or power detector may be included that can detect a measure of average power of a signal over a given time interval, for example.

Figure 3:
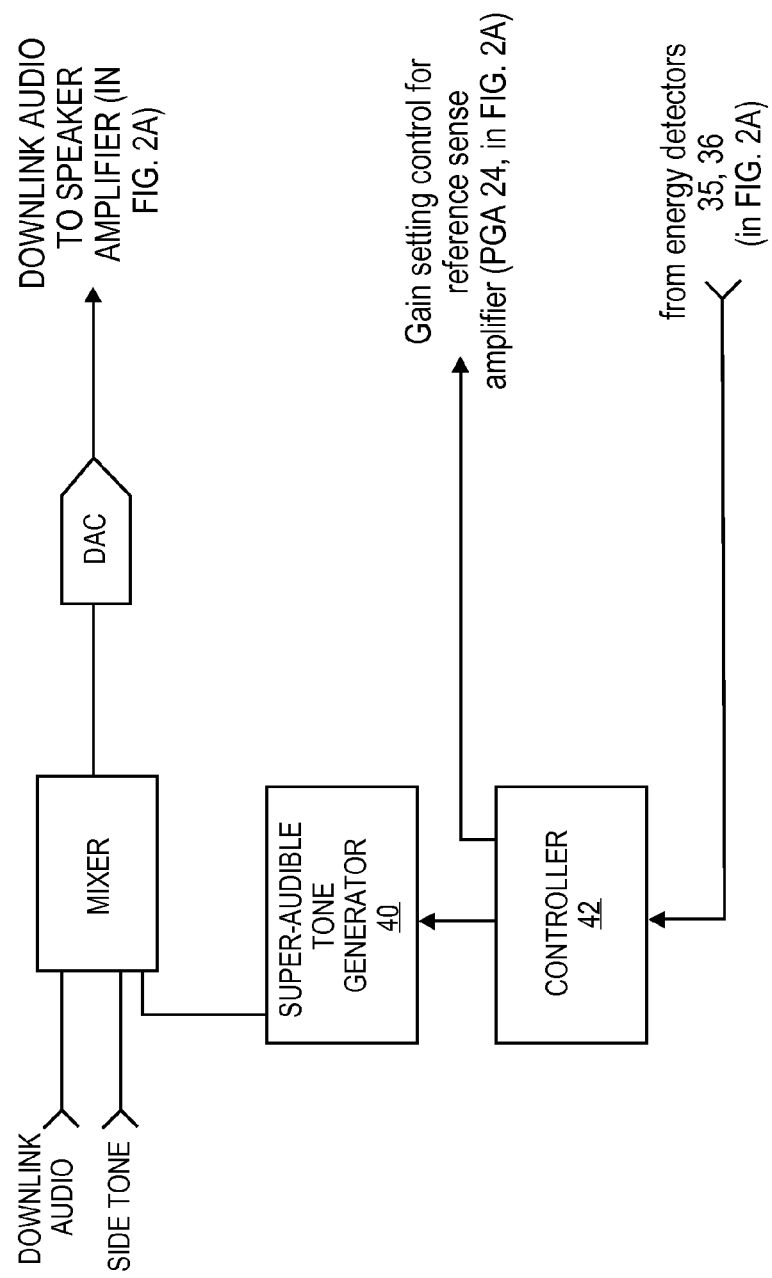
FIG. 3 is a block diagram of a closed loop controller coupled to a test signal generator.

In one embodiment, referring now to FIG. 3, a super-audible tone generator 40 is included, having an output coupled to the speaker contact 14' via, in this example, the mixer, the DAC, and the speaker amplifier. In this case, the controller 42 may be designed to signal the generator 40 to generate a super-audible tone that is played through the speaker contact 14'. This may be viewed as a calibration or test signal. The test signal may be played for a relatively short period of time, e.g. a few seconds, while the gain setting of the PGA 24 is automatically swept over a range that is sufficiently broad as to produce the expected minimum at the output of the gamma channel (difference amplifier 28). The state that yields the minimum is accepted as the final setting that provides improved or optimized noise reduction for the current microphone-speaker combination that is being used with the host device 10. Note that by virtue of being super-audible, the test signal even though driving the connected speaker 18 cannot be heard by the end user of the host device 10, and is close enough to the audible spectrum to be useful in the calibration process.

In another embodiment, the test signal is any signal applied to the speaker contacts and detected in the signal recovered by the microphone amplifier. The test signal may therefore be constrained along fairly broad lines, examples being individual tones or combinations of tones spread above, below, and in special cases through the audio band used in the product. The significant constraint on choice of the test signal is that it not be distracting to the user. In consequence, because the application of the test signal is not necessarily continuous, its spectral characteristics can be designed to fulfill other system requirements.

Figure 4:
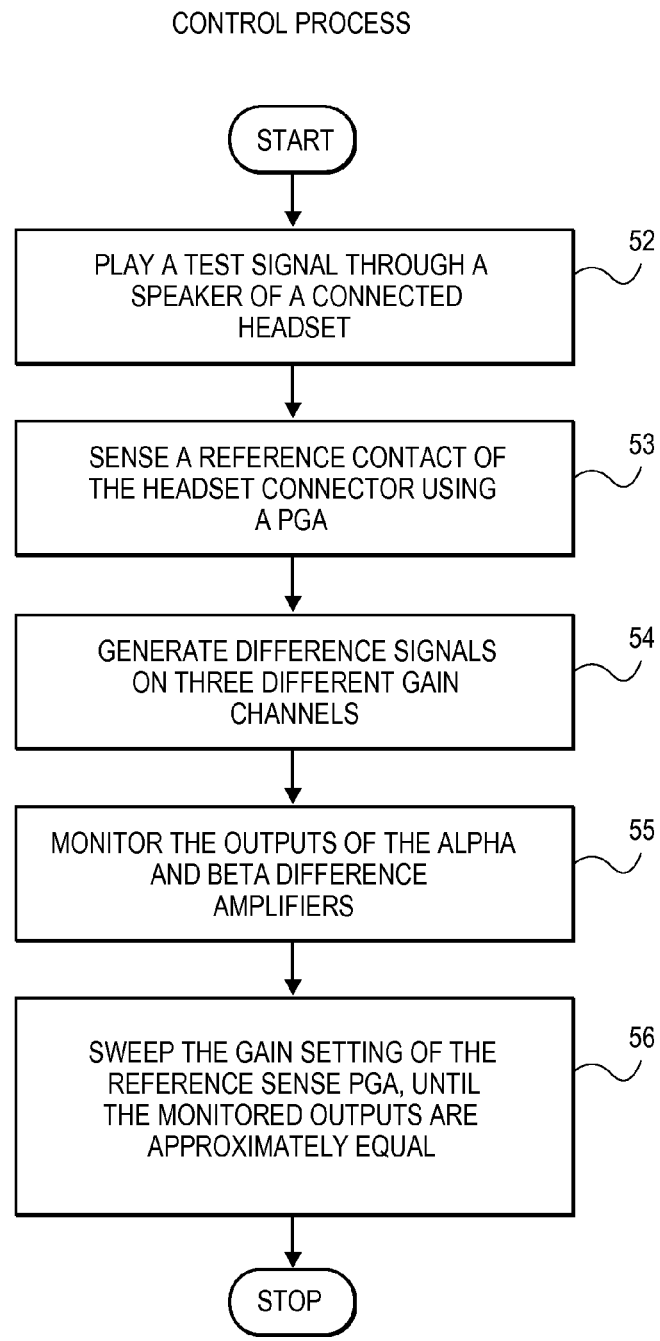
FIG. 4 is a flow diagram of a control process for configuring a microphone preamplifier.

FIG. 4 is a flow diagram of a process for operating the audio host device 10, and in particular configuring a microphone preamplifier block, to yield improved differential mode noise cancellation. Note that unless specified, the sequence of operations shown is not fixed, as it is possible that a given operation could in some cases be performed either ahead, after, or at the same time as others. In one embodiment of the invention, the microphone preamplifier control process begins with playing a test signal, e.g. a super-audible tone, through a speaker contact of a headset connector in the audio host device 10, while a speaker-microphone combination such as a headset is connected (operation 52). While the headset is connected and the super-audible tone is being played, a reference contact of the connector is sensed according to a gain setting that is variable (operation 53). The reference contact is one that is shared by the speaker and by the microphone of the connected microphone-speaker combination.

A first voltage difference signal, being a measure of the difference in voltage between the microphone contact and the sensed reference contact (the latter having been amplified according to a first gain value, alpha). In addition, a second voltage difference signal is generated, representing the difference in voltage between the microphone contact and the sensed reference contact amplified according to a second, different gain value, beta. A third voltage difference signal is generated, representing the difference in voltage between the microphone contact and the sensed reference contact amplified according to a third gain value gamma that is in between the first and second gain values. These three voltage difference signals may be generated simultaneously, while the speaker-microphone combination is connected and the super-audible tone is playing (operation 54).

The first and second difference signals are simultaneously monitored (operation 55). In particular, their size (e.g., signal processing energy, power, or RMS value) is monitored. While monitoring the first and second difference signals, the gain setting for the sensing the reference contact is changed (swept) until a predefined condition or state for the first and second difference signals is detected that would indicate a sufficiently reduced noise level for the microphone preamplifier has been reached (operation 56). This is also referred to here as sweeping the gain, over a sufficiently wide range that is expected to yield a minimum in the noise level seen in the third difference signal. The gain setting that results in the minimum may then be selected as the final setting. In the example flow diagram of FIG. 4, the predefined condition or state that indicates a minimum has been reached is when the first and second difference signals have about equal size.

Figure 5:
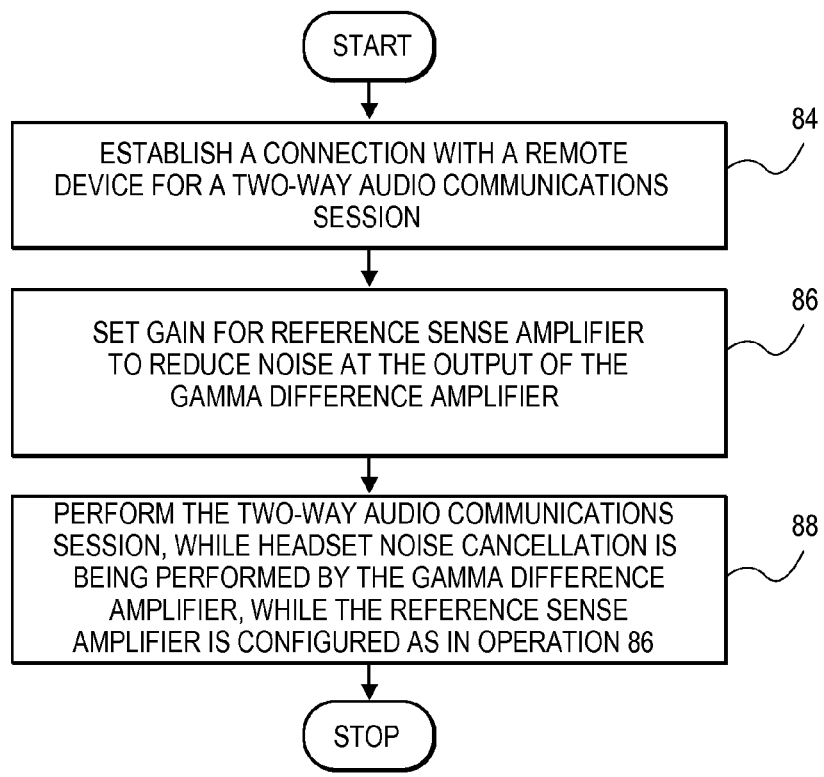
FIG. 5 is a flow diagram of a process for conducting a telephone call with the host device, in accordance with an embodiment of the invention.

FIG. 5 is a flow diagram of a process for conducting a telephone call using the host device 10, with improved SNR or reduced far end echo, in accordance with an embodiment of the invention. Note that the sequence of operations shown is not fixed; a given operation may in some cases be performed either ahead, after or at the same time as the others. Beginning with operation 84, the host device 10 establishes a connection with a remote device for a two-way audio communication session (also referred to here as a voice or video telephone call). This may be done by responding to an incoming call signal from a remote host, e.g. going off hook, or initiating a call that is answered by a remote device.

In operation 86, the host device 10 configures a microphone preamplifier block to reduce noise at its output. This occurs by setting the gain of a variable gain, reference sense amplifier (e.g., PGA 24), in accordance with any one of the techniques described above (e.g., monitoring the output of the alpha and beta difference amplifier channels while sweeping the PGA gain, until the monitored outputs reach the predefined condition that indicates a minimum in noise has been reached at the output of the gamma channel).

In operation 88, the telephone call is performed with the benefit of noise cancellation being obtained at the output of the gamma difference amplifier channel (as this channel has been configured in operation 86). Thus, the far end user of the call should be able to better hear the near end user (in the uplink communications signal that originated at the output of the gamma difference amplifier), with higher signal to noise ratio and/or diminished echo of his own voice.

It should be noted that the selection in operation 86 could occur either before the call is established in operation 84, or it could occur during the call (e.g., as soon as the conversation begins—during operation 88).

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although the host device is described in several instances as being a portable device, the noise reduction circuitry could also be useful in certain non-portable host devices such as desktop personal computers that also have similar limitations regarding interior signal routing and a shared reference contact in the headset electrical interface. Also, the concept need not be limited to the described combination of one microphone and one or two speakers. The technique disclosed can be used without loss of generality or performance to m microphones and s speakers, requiring, in general between 2(m+s) to m+s+1 separate connections through the headset electrical interface. The description is thus to be regarded as illustrative instead of limiting.

What is claimed is:
1. An audio host device comprising:
an electrical interface having a speaker contact, a microphone contact, and a reference contact, the reference contact to be shared by a microphone and a speaker, the reference contact being directly coupled to a power return plane of the audio host device;

a programmable gain amplifier, PGA, having a signal input coupled to a sense point for the reference contact;

a first difference amplifier having a pair of inputs, one of the pair of inputs being coupled to the microphone contact, and the other being coupled to a signal output of the PGA through a first gain stage;

a second difference amplifier having a pair of inputs, one of the pair of inputs being coupled to the microphone contact, and the other being coupled to the output of the PGA through a second gain stage having a different gain than the first gain stage;

a third difference amplifier having a pair of inputs, one of the pair of inputs being coupled to the microphone contact, and the other being coupled to the output of the PGA through a third gain stage having a gain in between that of the first and second gain stages; and a controller having an output coupled to a control input of the PGA, the controller to monitor outputs of the first and second difference amplifiers and change a gain setting of the PGA.

2. The audio host device of claim 1 further comprising:
first and second energy detectors having inputs coupled to the outputs of the first and second difference amplifiers, respectively,
wherein the controller has inputs coupled to outputs of the first and second energy detectors to monitor signal processing energy at the outputs of the first and second difference amplifiers.

3. The audio host device of claim 1 wherein the controller is to sweep the gain setting of the PGA while monitoring the outputs of the first and second difference amplifiers, to detect a final gain setting for the PGA that equalizes the monitored outputs.

4. The audio host device of claim 3 further comprising:
a mixer having an output coupled to the speaker contact, a first input to receive a downlink communications audio signal, and a second input to receive a sidetone signal from an output of the third difference amplifier.

5. The audio host device of claim 3 wherein the controller is to configure the PGA with the final gain setting, and wherein the audio host device is to generate an uplink communications signal from an output of the third difference amplifier while the PGA is configured with said final gain setting.

6. The audio host device of claim 3 further comprising:
a test signal generator having an output coupled to the speaker contact, wherein the controller is further coupled to control the test signal generator,
the generator to produce a test signal through the speaker contact while the controller changes the gain of the PGA and monitors outputs of the first and second difference amplifiers.

7. The audio host device of claim 1 further comprising:
first and second DC blocking capacitors, the first coupled between the signal input of the PGA and the reference sense point, the second between said one of the pair of inputs of the third difference amplifier and the microphone contact.

8. The audio host device of claim 7 further comprising a DC bias circuit coupled to set a voltage on the microphone contact.

9. The audio host device of claim 6 further comprising a mixer having an output coupled to the speaker contact,
wherein the mixer has an input coupled to the output of the test signal generator and another input to receive a downlink communications audio signal.

10. An audio host device comprising:
a headset connector having a speaker contact, a microphone contact, and a reference contact, the reference contact to be shared by a microphone and a speaker of a headset that is to be coupled to the connector, the reference contact being directly coupled to a power return plane of the audio host device;

a programmable gain amplifier, PGA, having a signal input coupled to a sense point for the reference contact;

a first difference amplifier having a pair of inputs, one of the pair of inputs being coupled to the microphone contact, and the other being coupled to a signal output of the PGA through a first gain stage;

a second difference amplifier having a pair of inputs, one of the pair of inputs being coupled to the microphone contact, and the other being coupled to the output of the PGA through a second gain stage having a different gain than the first gain stage;

a third difference amplifier having a pair of inputs, one of the pair of inputs being coupled to the microphone contact, and the other being coupled to the output of the PGA through a third gain stage having a gain in between that of the first and second gain stages; and a controller having an output coupled to a control input of the PGA.

11. The audio host device of claim 10 wherein the first, second and third difference amplifiers are replicates including the same gain.

12. The audio host device of claim 11 wherein the gain of the third gain stage is about the average of the gains of the first and second gain stages.

13. The audio host device of claim 10 further comprising a mixer having an output coupled to the speaker contact,
wherein the mixer has an input coupled to receive a downlink communications audio signal and another input coupled to receive a sidetone signal from an output of the third difference amplifier.

14. A method for operating an audio host device having a headset electrical interface, comprising:
a) sensing a reference contact of the headset electrical interface according to a gain setting, wherein the reference is shared by a speaker and a microphone of a microphone-speaker combination that are coupled to the headset electrical interface;
b) generating a first voltage difference between a microphone contact of the interface and the sensed reference contact amplified according to a first gain value;
c) generating a second voltage difference between the microphone contact and the sensed reference contact amplified according to a second, different gain value;
d) generating a third voltage difference between the microphone contact and the sensed reference contact amplified according to a third gain value that is in between the first and second gain values;
e) monitoring each of the first and second voltage differences; and
f) changing the gain setting for sensing the reference contact.

15. The method of claim 14 further comprising:
transmitting an uplink communications signal from the third voltage difference.

16. The method of claim 14 wherein the second gain value is about average of the first and second gain values.

17. The method of claim 14 wherein said monitoring comprises detecting one of signal processing energy and power in the first and second voltage differences.

18. The method of claim 17 further comprising:
accepting as final a gain setting for sensing the reference contact, that is closest to a gain setting at which the detected signal processing energy or power in the first and second voltage differences are about equal; and
generating an uplink communications signal from the third voltage difference while using the final gain setting for sensing the reference contact.

19. The method of claim 14 further comprising:
playing a test signal through a speaker contact of the headset electrical interface, while the speaker-microphone combination is coupled to the interface and while performing a)-f).

* * * * *